US009455741B2

(12) United States Patent
Li et al.

(10) Patent No.: US 9,455,741 B2
(45) Date of Patent: Sep. 27, 2016

(54) METHOD FOR COLLECTING SIGNAL WITH SAMPLING FREQUENCY LOWER THAN NYQUIST FREQUENCY

(71) Applicant: Institute of Microelectronics, Chinese Academy of Sciences, Beijing (CN)

(72) Inventors: Dongmei Li, Beijing (CN); Xiaojing Li, Beijing (CN); Shengfa Liang, Beijing (CN); Hao Zhang, Beijing (CN); Qing Luo, Beijing (CN); Changqing Xie, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/805,868

(22) Filed: Jul. 22, 2015

(65) Prior Publication Data

US 2015/0326246 A1    Nov. 12, 2015

Related U.S. Application Data

(63) Continuation of application No. PCT/CN2013/076762, filed on Jun. 5, 2013.

(51) Int. Cl.
   *H03M 7/30*     (2006.01)
   *H04L 27/26*    (2006.01)

(52) U.S. Cl.
   CPC ............. *H03M 7/3062* (2013.01); *H03M 7/30* (2013.01); *H04L 27/2642* (2013.01)

(58) Field of Classification Search
   CPC .. H03M 7/30; H03M 7/3059; H03M 7/3062; H04L 5/00; H04L 5/0005; H04L 5/0007; H04L 5/0008; H04L 27/26; H04L 27/2601; H04L 27/2602; H04L 27/2604; H04L 27/2626; H04L 27/2628; H04L 27/263; H04L 27/2634; H04L 27/2636; H04L 27/2639; H04L 27/264; H04L 27/2642; H04L 27/2644

USPC ........ 375/259, 260, 262, 265, 340, 341, 349, 375/355; 370/208, 210

See application file for complete search history.

(56) References Cited

U.S. PATENT DOCUMENTS 7,289,049 B1    10/2007  Fudge et al.
7,345,603 B1     3/2008  Wood et al.
(Continued)

FOREIGN PATENT DOCUMENTS

CN    101895297 A    11/2010
CN    102253117 A    11/2011
CN    103346798 A    10/2013

OTHER PUBLICATIONS

Wang, Tianjing et al., "Filter-Based Compressed Sensing Signal Collection Scheme", Chinese Journal of Scientific Instrument, Mar. 2013, vol. 34, No. 3, pp. 573-581.
(Continued)

*Primary Examiner* — Young T Tse
(74) *Attorney, Agent, or Firm* — BainwoodHuang

(57) ABSTRACT

A method for collecting a signal with a frequency lower than a Nyquist frequency includes, by a data transmitting end, selecting a suitable transformation base matrix for an input signal, deriving a sparse representation of the signal using the transformation base matrix to determine a sparsity of the signal, calculating a number M of compressive sampling operations according to the sparsity, sampling the signal with $f_{NYQ/M}$ using M channels, and integrating sampling values of each channel to obtain M measurement values. A reconstruction end reconstructs an original signal by solving optimization problems. Based on theory, compressive sampling can be performed on a sparse signal or a signal represented in a sparse manner with a frequency much lower than the Nyquist frequency, overcoming restrictions of the typical Nyquist sampling theorem. The method can be implemented simply and decrease pressure on data collection, storage, transmission and processing.

8 Claims, 4 Drawing Sheets

(56) References Cited

U.S. PATENT DOCUMENTS

| | | | | |
|---|---|---|---|---|
| 2011/0294453 | A1* | 12/2011 | Mishali | H04B 1/0092 455/293 |
| 2013/0187682 | A1* | 7/2013 | Eldar | H03K 5/00 327/91 |
| 2013/0278295 | A1* | 10/2013 | Kim | H03B 21/00 327/105 |
| 2014/0232581 | A1* | 8/2014 | Nguyen | H03M 1/12 341/155 |

OTHER PUBLICATIONS

Office Action issued Oct. 8, 2015 from SIPO of China in counterpart Chinese Patent Application No. 201310220522.8, pp. 1-7, English translation of Office Action issued Oct. 8, 2015, pp. 8-11.

Zhao Yijiu, et al., "Random Equivalent Sampling Signal Reconstruction Based on Compressed Sensing", School of Automation Engineering, University of Electronics Science and Technology of China, Chegdu 611731, China, vol. 32, No. 2, Feb. 2011, pp. 247-251.

\* cited by examiner

METHOD FOR COLLECTING SIGNAL WITH SAMPLING FREQUENCY LOWER THAN NYQUIST FREQUENCY

TECHNICAL FIELD

The present disclosure relates to a method of collecting a signal with a sampling frequency lower than a Nyquist frequency, which can implement compressive sampling on a sparse signal or a signal which can be represented in a sparse form with a sampling frequency much lower than the Nyquist frequency and reconstruct an original signal.

BACKGROUND

The Nyquist sampling theorem is a basis for modern communication and signal processing. The theorem regulates that in a process of analog/digital signal conversion, when a sampling frequency is no less than double of a highest frequency of a signal, the sampled digital signal completely retains information in the original signal. In general, in practical applications, it is ensured that the sampling frequency is 5-10 times of the highest frequency of the signal.

A broadband signal has a high frequency, and if the signal is directly sampled using the Nyquist sampling theorem, a very high sampling frequency is required. However, the existing analog-to-digital converter has a highest frequency of 1 GHz, which is difficult to satisfy the requirements for high frequencies. In addition, after the signal is processed by the analog-to-digital converter, the signal is generally stored for data communication and processing later. In this case, high-speed sampling puts high requirements for a storage speed of a memory and a processing speed of a digital signal processor. Therefore, if the broadband signal is sampled using the Nyquist sampling theorem, enormous pressures are brought to collection, storage, transmission and processing of the broadband signal.

Further, the Nyquist sampling theorem is developed to only use the minimum prior information of the signal to be sampled, i.e., a bandwidth of the signal, but does not use some structural characteristics of the signal per se, such as redundancy or the like.

In general, although the processed signal per se is not sparse, the signal may be represented in a sparse form under some transformation bases. Compressive sensing, as an emerging theorem, is to sample the signal with a frequency much lower than the Nyquist frequency by utilizing the sparse characteristics of the signal. The compressive sensing theorem regulates that as long as a high-dimensional signal can be represented in a sparse form under some transform domain, the high-dimensional signal can be projected into a low-dimensional space by using an observation matrix independent of the transformation base matrix, and then the original high-dimensional signal can be reconstructed from a few projections by solving optimization problems.

SUMMARY

I. Technical Problem to be Solved

In view of this, an object of the present disclosure is to provide a method of collecting a signal with a sampling frequency lower than a Nyquist frequency, which can sample and reconstruct a signal with a sampling frequency much lower than the Nyquist frequency, overcome restrictions of the typical Nyquist sampling theorem on the sampling frequency, and decrease the pressures on collection, storage, transmission and processing of the broadband signal.

II. Technical Solution

For this purpose, the present disclosure provides a method of collecting a signal with a sampling frequency lower than a Nyquist frequency, comprising: determining, by a data transmitting end, a sparsity k of an original input signal x, calculating a number M of compressive sampling operations according to the sparsity k, sampling the original input signal x with a frequency $f_{NYQ}/M$ using M channels respectively, wherein $f_{NYQ}$ is the Nyquist frequency of the original input signal x, integrating sampling values of each channel to obtain M measurement values y, and then transmitting the M measurement values y to a data receiving end; and restoring, by the data receiving end, the received M measurement values y to a sparse representation of the original input signal x using an orthogonal matching pursuit algorithm, and then obtaining the original input signal x by performing an inverse transformation on the sparse representation.

In the above solution, determining, by the data transmitting end, the sparsity k of the original input signal x comprises: selecting, by the data transmitting end, a transformation base matrix according to a feature of the original input signal x, deriving the sparse representation of the original input signal x using the transformation base matrix, and then calculating the sparsity k of the original input signal x under the transformation base matrix.

In the above solution, in the step of selecting, by the data transmitting end, the transformation base matrix according to the feature of the original input signal x, a Fourier transformation base matrix is used for a smooth original input signal, and a Wavelet transformation base matrix is used for a single-point type singular signal.

In the above solution, the smooth original input signal comprises a sine signal, a cosine signal, an exponential signal or a sampling pulse which is varied continuously; and the signal-point type singular signal comprises an impulse signal, a rectangular pulse, or a spike signal which is varied discontinuously.

In the above solution, in the step of calculating, by the data transmitting end, the number M of the compressive sampling operations according to the sparsity k, the number M of the compressive sampling operations satisfies the following two conditions:

a. $M \geq k \cdot \ln(N/k)$, wherein N is a dimension of a high-dimensional original input signal, and k is the sparsity of the original input signal under a related transformation base; and b. $N = A \times M$, wherein A is an integer no less than 1, i.e., the dimension of the high-dimensional original input signal is an integer times of the number M of the compressive sampling operations.

In the above solution, in the step of integrating, by the data transmitting end, the sampling values of each channel to obtain the M measurement values y, an integration period is A times of a sampling period of each channel.

In the above solution, restoring, by the data receiving end, the received M measurement values y to the sparse representation of the original input signal x using the orthogonal matching pursuit algorithm comprises: obtaining the measurement values y by solving the mathematical equation of $y = \Phi x$ using the original input signal x, wherein the original input signal x is an N×1 vector, the measurement values y are an M×1 vector, and the observation matrix $\Phi$ is an M×N toeplitz matrix, which is obtained by combining a number A=N/M of M×M identity matrixes in a row direction, wherein in a case that the original input signal x is to be solved when the measurement values y and the observation matrix Φ are known, the original input signal x can be obtained by solving for an optimal $l_1$-norm since the original input signal x is sparse, and the orthogonal matching pursuit algorithm is an approach for solving to obtain the original input signal x using the measurement values y and the observation matrix Φ by multiple iterations.

In the above solution, obtaining, by the data receiving end, the original input signal by performing the inverse transformation on the sparse representation comprises: performing the inverse transformation on the sparse representation of the original signal obtained using the orthogonal matching pursuit algorithm, according to the transformation base matrix selected when deriving the sparse representation of the original input signal x, wherein if the transformation base matrix selected when deriving the sparse representation of the original input signal x is a Fourier transformation base matrix, the inverse transformation is a discrete Fourier transformation, and if the transformation base matrix selected when deriving the sparse representation of the original input signal x is a Wavelet transformation base matrix, the inverse transformation is a discrete Wavelet transformation.

III. Beneficial Effects

Based on the compressive sensing theory, the method of collecting the signal with the sampling frequency lower than the Nyquist frequency according to the present disclosure can perform the compressive sampling on the sparse signal or the signal which can be represented in the sparse manner with a frequency much lower than the Nyquist frequency, and overcome the restrictions of the typical Nyquist sampling theorem on the sampling frequency. In addition, the method only has two steps of low-speed sampling and integration, which are simple to realize and decrease the pressures on data collection, storage, transmission and processing.

BRIEF DESCRIPTION OF THE DRAWINGS

For further describing the content of the present disclosure, the present disclosure will be described in detail below in conjunction with accompanying drawings and examples, wherein.

DETAILED DESCRIPTION

To make the purpose, technical solutions and advantages of the present disclosure more clear and obvious, the present disclosure will be further described in detail below in conjunction with specific embodiments and with reference to accompanying drawings.

Figure 1:
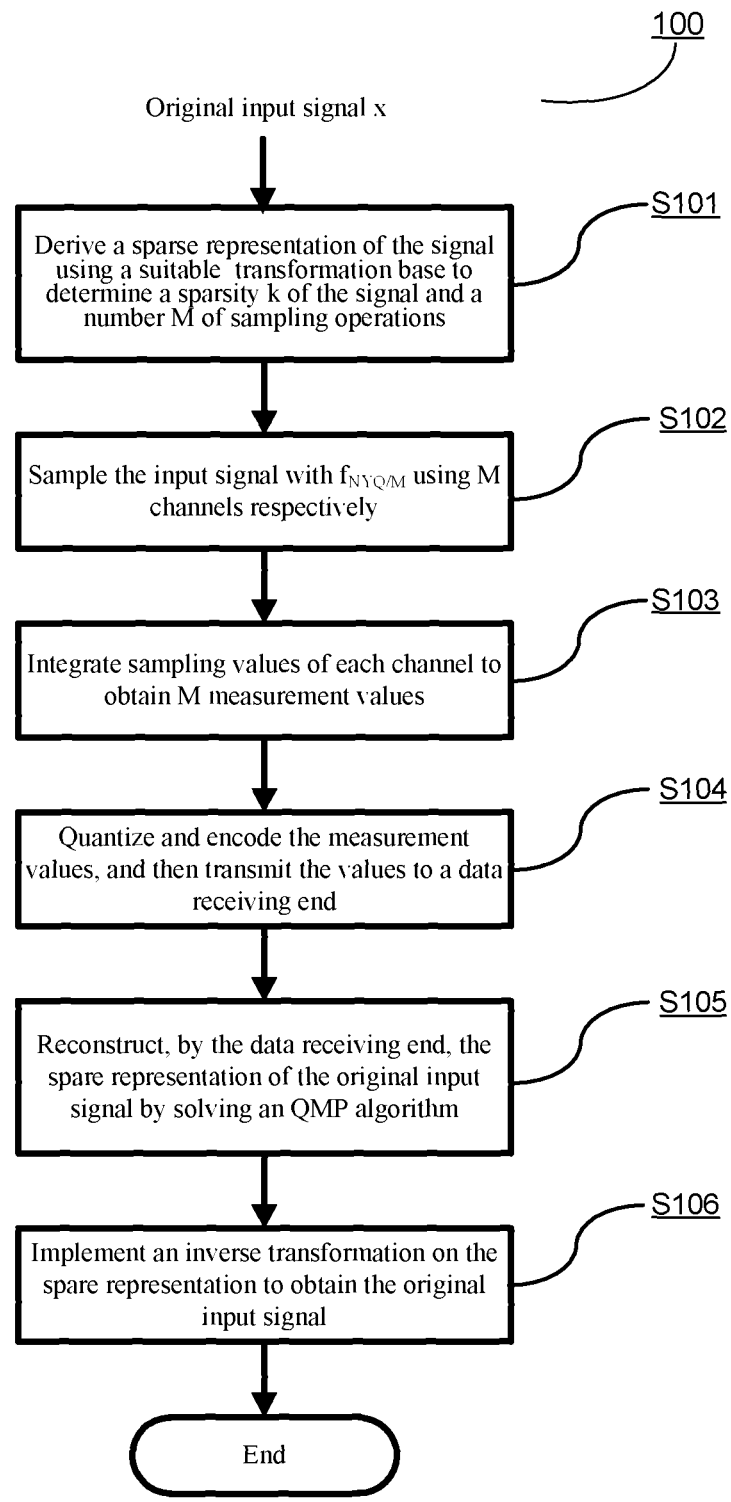
FIG. 1 illustrates a flowchart of a method of collecting a signal with a sampling frequency lower than a Nyquist frequency according to the present disclosure.

As shown in FIG. 1, illustrated is a flowchart of a method 100 of collecting a signal with a sampling frequency lower than a Nyquist frequency according to the present disclosure. On the basis of compressive sensing thereon, this method 100 achieves signal collection with a high probability with a frequency much lower than the Nyquist frequency, and comprises the following steps:

S101: a data transmitting end determines a sparsity k of an original input signal x, calculates a number M of compressive sampling operations according to the sparsity k;

S102: the data transmitting end samples the original input signal x with a frequency of $f_{NYQ}/M$ using M channels respectively, wherein $f_{NYQ}$ is the Nyquist frequency of the original input signal x;

S103: the data transmitting end integrates sampling values of each channel to obtain M measurement values y;

S104: the data transmitting end transmits the M measurement values y which are quantized and encoded to a data receiving end;

S105: the data receiving end restores the received M measurement values y to a sparse representation of the original input signal x using an orthogonal matching pursuit algorithm, and S106: the data receiving end obtains the original input signal x by performing an inverse transformation on the sparse representation.

Determining, by the data transmitting end, the sparsity k of the original input signal x comprises: selecting, by the data transmitting end, a transformation base matrix according to a feature of the original input signal x, deriving the sparse representation of the original input signal x using the transformation base matrix, and then calculating the sparsity k of the original input signal x under the transformation base matrix. In the step of selecting, by the data transmitting end, a transformation base matrix according to the feature of the original input signal x, a Fourier transformation base matrix is used for a smooth original input signal, and a Wavelet transformation base matrix is used for a single-point type singular signal. The smooth original input signal comprises a continuously varied signal, such as sine signal, a cosine signal, an exponential signal, a sampling pulse or the like, and the signal-point type singular signal comprises a discontinuously varied signal, such as an impulse signal, a rectangular pulse, a spike signal or the like.

In the step of calculating, by the data transmitting end, the number M of the compressive sampling operations according to the sparsity k, the number M of the compressive sampling operations satisfies the following two conditions: a. $M \geq k \cdot \ln(N/k)$, wherein N is a dimension of a high-dimensional original input signal, and k is the sparsity of the original input signal under a related transformation base; and b. N=A×M, wherein A is an integer no less than 1, i.e., the dimension of the high-dimensional original input signal is integer times of the number M of compressive sampling operations. In the step of integrating, by the data transmitting end, the sampling values of each channel to obtain the M measurement values y, an integration period is A times of a sampling period of each channel.

The process of restoring, by the data receiving end, the received M measurement values y to the sparse representation of the original input signal x using the orthogonal matching pursuit algorithm is a process of solving the original input signal x using the measurement values y and an observation matrix Φ according to a mathematical equation of y=Φx by multiple iterations, comprising: obtaining the measurement values y by solving the mathematical equation of y=Φx using the original input signal x, wherein the original input signal x is an N×1 vector, the measurement values y are an M×1 vector, and the observation matrix t is an M×N toeplitz matrix, which is obtained by combining a number A=N/M of M×M identity matrixes in a row direction. In a case that the original input signal x is to be solved when the measurement values y and the observation matrix Φ are known, the original input signal x may be obtained by solving for an optimal $l_1$-norm since the original input signal x is sparse. The orthogonal matching pursuit algorithm is an approach for solving to obtain the original input signal x using the measurement values y and the observation matrix Φ by multiple iterations.

Obtaining the original input signal x by performing the inverse transformation on the sparse representation comprises: performing the inverse transformation on the sparse representation of the original signal obtained using the orthogonal matching pursuit algorithm according to the transformation base matrix selected when deriving the sparse representation of the original input signal x, wherein if the transformation base matrix selected when deriving the sparse representation of the original input signal x is a Fourier transformation base matrix, the inverse transformation is a discrete Fourier transformation, and if the transformation base matrix selected when deriving the sparse representation of the original input signal x is a Wavelet transformation base matrix, the inverse transformation is a discrete Wavelet transformation.

Figure 2:
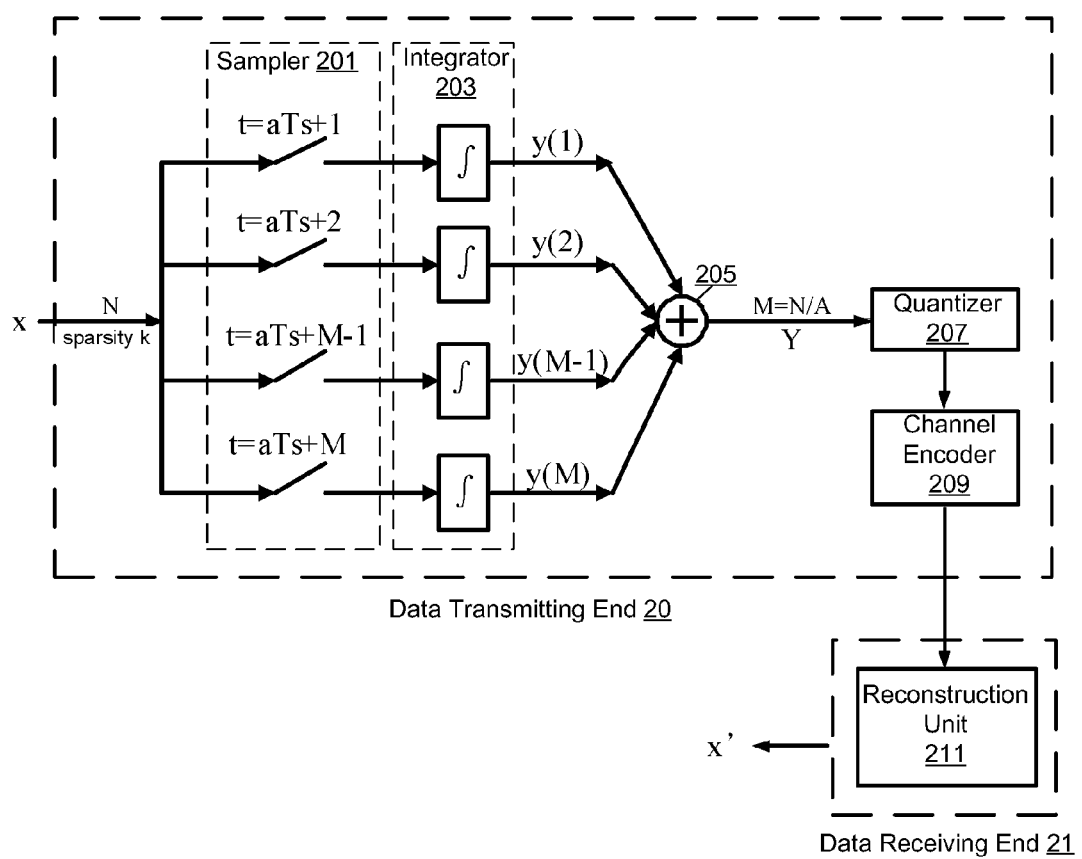
FIG. 2 illustrates a diagram of signal collection and reconstruction according to an embodiment of the present disclosure.
Figure 3:
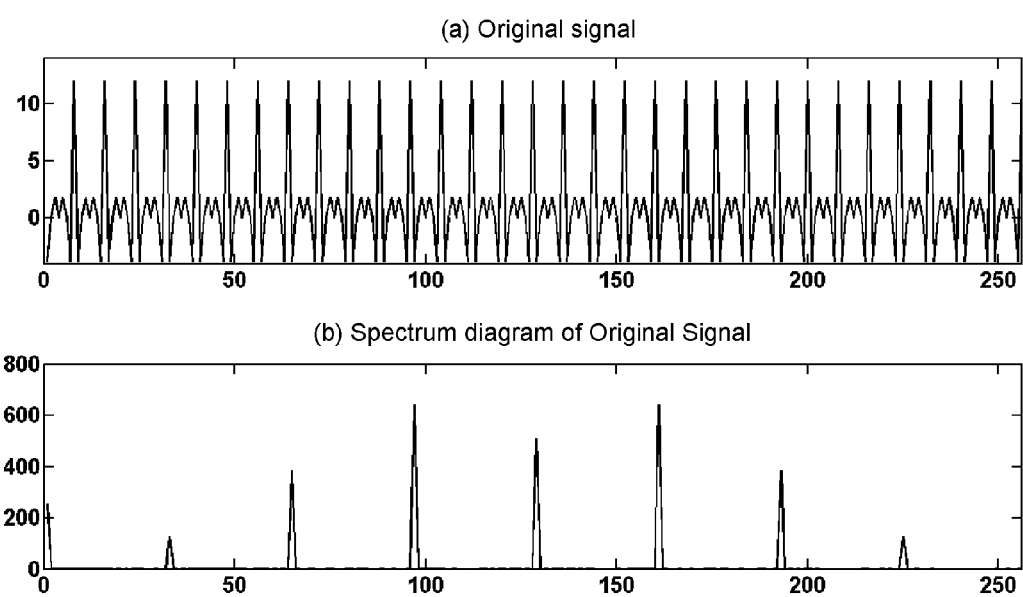
FIG. 3 illustrates a sine signal at 50 Hz, 100 Hz, 150 Hz, and 200 Hz and a frequency domain representation thereof according to an embodiment of the present disclosure, wherein the upper diagram is an original signal diagram, and the lower diagram is a sparse representation diagram after Fourier transformation.
Figure 4:
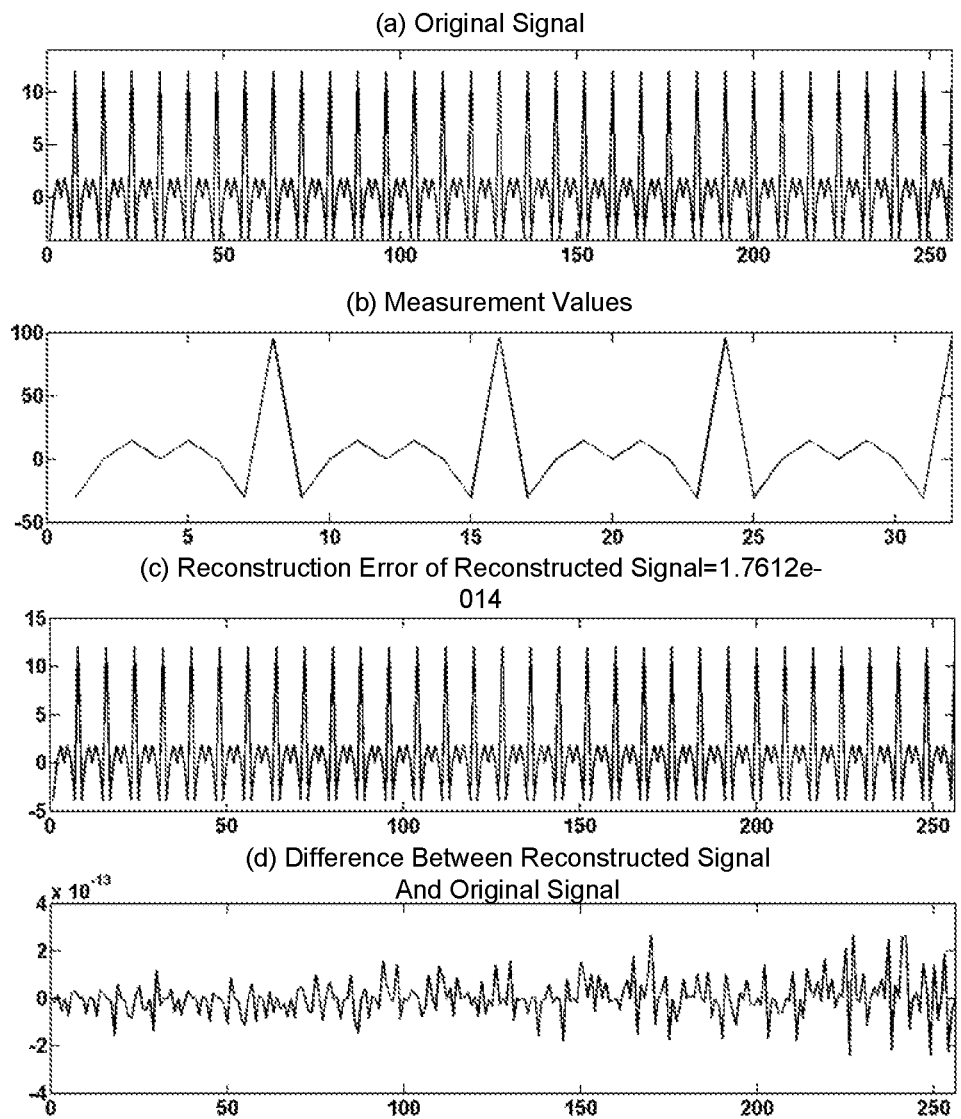
FIG. 4 illustrates an effect diagram of signal sampling and reconstruction according to an embodiment of the present disclosure, wherein (a) illustrates an original signal, (b) illustrates sampling values, (c) illustrates a reconstructed signal, and (d) illustrates an error between the reconstructed signal and the original signal.

Based on the flowchart of the method for collecting a signal with a sampling frequency lower than a Nyquist frequency according to the present discourse illustrated in FIG. 1, the present disclosure will be further described in detail with reference to FIGS. 2-4 by taking a sine signal (with a signal length of N=256) at frequencies of 50 Hz, 100 Hz, 150 Hz and 200 Hz as an example. FIG. 2 is a diagram of signal collection and reconstruction according to an embodiment of the present disclosure.

As shown in FIG. 2, in a first step, the data transmitting end 20 derives a sparse representation of an original input signal x.

Since the original input signal is a sine signal, the data transmitting end derives the sparse representation of the original input signal using a Fourier transformation base matrix. As shown in FIG. 3, the upper diagram is an original input signal diagram, and the lower diagram is a sparse representation diagram after Fourier transformation. It can be seen that the original input signal only has 8 non-zero values, and other values are zero. That is, the sparsity k of the signal is 8.

In a second step, the data transmitting end 20 samples the original input signal x at a sampling frequency of $f_{NYQ}/M$ by a sampler 201.

Firstly, a value of a number M of sampling compressive operations is determined. M should satisfy the following two conditions: (a) M≥k·ln(N/k), wherein N is a dimension of an original high-dimensional signal, and k is a sparsity of the signal under a related transformation base, and (b) N=A×M, wherein A is an integer no less than 1. Therefore, it is assumed here that M=32 and A=8. Then, the original input signal x is sampled by the sampler 201 at a sampling frequency of $f_{NYQ}/32$ ($f_{NYQ}$=400 Hz) using 32 channels respectively. 8 sampling values are obtained for each channel, and are integrated by an integrator 203 with an integration period which is A times of a sampling period of the channel. In this way, 32 measurement values y may be obtained at different times, may be saved by a summing unit 205 sequentially to obtain a sequence of the measurement values y which is represented by an M×1 vector, and after being quantized by a quantizer 207 and encoder by a channel encoder 209, are transmitted directly to a data receiving end. As shown in FIG. 4(a), illustrated is the original signal diagram, and as shown in FIG. 4(b), illustrated are the obtained 32 sampling values.

In a third step, the data receiving end 21 reconstructs the original input signal x.

The data receiving end 21 reconstructs the received low-dimensional data (i.e., measurement values y) into the original high-dimensional data using an orthogonal matching pursuit algorithm in a reconstruction unit 211. The measurement values y obtained through the first step S1 and the second step S2 are equivalent to measurement values y obtained by solving a mathematical equation of y=Φx using the original input signal x, wherein the original input signal x is an N×1 vector, the measurement values y are an M×1 vector, and the observation matrix Φ is an M×N toeplitz matrix which is obtained by combining a number A=N/M of M×M identity matrixes in a row direction. In a case that the original input signal x is to be solved when the measurement values y and the observation matrix Φ are known, the original input signal x may be obtained by solving for an optimal $l_1$-norm since the original input signal x is sparse. The orthogonal matching pursuit algorithm is an approach for solving the original input signal x using the measurement values y and the observation matrix Φ by multiple iterations.

FIG. 4(c) illustrates the reconstructed signal with an error at $10^{-14}$ order magnitude which is very small, and FIG. 4(d) illustrates a difference between the reconstituted signal and the original signal, which is at $10^{-13}$ order magnitude. It can be seen that the method can achieve compressive sampling of the signal with a frequency much lower than the Nyquist frequency, and can well recover the original high-dimensional signal from few sampling values.

The specific embodiments described above are used to further describe the purpose, technical solutions and beneficial effects of the present disclosure in detail. It should be understood that the above description is merely specific embodiments of the present disclosure, instead of limiting the present disclosure. Any amendment, equivalent substitution, improvement or the like made within the spirit and principle of the present disclosure should be included in the protection scope of the present disclosure.

What is claimed is:

1. A method of collecting a signal with a sampling frequency lower than a Nyquist frequency, comprising:
    determining, by a data transmitting end, a sparsity k of an original input signal x, calculating a number M of compressive sampling operations according to the sparsity k, sampling the original input signal x with a frequency $f_{NYQ}/M$ using M channels respectively, wherein $f_{NYQ}$ is the Nyquist frequency of the original input signal x, integrating sampling values of each channel to obtain M measurement values y, and then transmitting the M measurement values y to a data receiving end; and
    restoring, by the data receiving end, the received M measurement values y to a sparse representation of the original input signal x using an orthogonal matching pursuit algorithm, and then obtaining the original input signal x by performing an inverse transformation on the sparse representation.

2. The method according to claim 1, wherein determining, by the data transmitting end, the sparsity k of the original input signal x comprises:

selecting, by the data transmitting end, a transformation base matrix according to a feature of the original input signal x, deriving the sparse representation of the original input signal x using the transformation base matrix, and then calculating the sparsity k of the original input signal x under the transformation base matrix.

3. The method according to claim 2, wherein, in the step of selecting, by the data transmitting end, the transformation base matrix according to the feature of the original input signal x, a Fourier transformation base matrix is used for a smooth original input signal, and a Wavelet transformation base matrix is used for a single-point type singular signal.

4. The method according to claim 3, wherein the smooth original input signal comprises a sine signal, a cosine signal, an exponential signal or a sampling pulse which is varied continuously; and the signal-point type singular signal comprises an impulse signal, a rectangular pulse, or a spike signal which is varied discontinuously.

5. The method according to claim 1, wherein, in the step of calculating, by the data transmitting end, the number M of the compressive sampling operations according to the sparsity k, the number M of the compressive sampling operations satisfies the following two conditions:
   a. M≥k·ln(N/k), wherein N is a dimension of a high-dimensional original input signal, and k is the sparsity of the original input signal under a related transformation base; and
   b. N=A×M, wherein A is an integer no less than 1, i.e., the dimension of the high-dimensional original input signal is an integer times of the number M of the compressive sampling operations.

6. The method according to claim 5, wherein, in the step of integrating, by the data transmitting end, the sampling values of each channel to obtain the M measurement values y, an integration period is A times of a sampling period of each channel.

7. The method according to claim 1, wherein restoring, by the data receiving end, the received M measurement values y to the sparse representation of the original input signal x using the orthogonal matching pursuit algorithm comprises:

obtaining the measurement values y by solving the mathematical equation of y=Φx using the original input signal x, wherein the original input signal x is an N×1 vector, the measurement values y are an M×1 vector, and the observation matrix Φ is an M×N Toeplitz matrix which is obtained by combining a number A=N/M of M×M identity matrixes in a row direction; wherein in a case that the original input signal x is to be solved when the measurement values y and the observation matrix Φ are known, the original input signal x can be obtained by solving for an optimal $l_1$-norm since the original input signal x is sparse, and the orthogonal matching pursuit algorithm is an approach for solving to obtain the original input signal x using the measurement values y and the observation matrix Φ by multiple iterations.

8. The method according to claim 7, wherein obtaining, by the data receiving end, the original input signal by performing the inverse transformation on the sparse representation comprises:

performing the inverse transformation on the sparse representation of the original input signal obtained using the orthogonal matching pursuit algorithm, according to a transformation base matrix selected when deriving the sparse representation of the original input signal x, wherein if the transformation base matrix selected when deriving the sparse representation of the original input signal x is a Fourier transformation base matrix, the inverse transformation is a discrete Fourier transformation, and if the transformation base matrix selected when deriving the sparse representation of the original input signal x is a Wavelet transformation base matrix, the inverse transformation is a discrete Wavelet transformation.

* * * * *